United States Patent [19]

Thapar

[11] Patent Number: 4,534,040
[45] Date of Patent: Aug. 6, 1985

[54] METHOD AND APPARATUS FOR CODING A BINARY SIGNAL

[75] Inventor: Hemant K. Thapar, Marlboro, N.J.

[73] Assignee: AT&T Information Systems, Holmdel, N.J.

[21] Appl. No.: 455,502

[22] Filed: Jan. 4, 1983

[51] Int. Cl.³ ............................................. H04L 3/00
[52] U.S. Cl. ............................. 375/39; 340/347 DD; 375/59
[58] Field of Search ............... 340/347 DD; 332/9 R, 332/10, 16 R; 375/39, 34, 59

[56] References Cited

U.S. PATENT DOCUMENTS

| | | | |
|---|---|---|---|
| 3,883,727 | 5/1975 | Stuart et al. | 333/28 R |
| 3,971,996 | 7/1976 | Motley et al. | 375/39 |
| 4,003,041 | 1/1977 | van Duuren et al. | 340/347 DD |
| 4,077,021 | 2/1978 | Csajka et al. | 332/9 |
| 4,123,710 | 10/1978 | Stuart et al. | 375/39 |

OTHER PUBLICATIONS

"Analog Transmission Performance on the Switched Telecommunications Network", *The Bell System Technical Journal*, vol. 50, No. 4, Apr. 1971, pp. 1311-1347.
"Channel Coding with Multilevel/Phase Signals", *IEEE Trans. on Information Theory*, vol. IT-28, No. 1, Jan. 1982, pp. 55-67.
"Viterbi Decoding for Satelite and Space Communication", *IEEE Trans. on Comm. Tech.*, vol. COM-19, No. 5, Oct. 1971, pp. 835-848.
"The Viterbi Algorithm", *Proceedings of the IEEE*, vol. 61, No. 3, Mar. 1973, pp. 268-278.

*Primary Examiner*—Errol A. Krass
*Assistant Examiner*—Thomas G. Black
*Attorney, Agent, or Firm*—Barry H. Freedman; Ronald D. Slusky

[57] ABSTRACT

An input bit sequence is encoded for transmission on a QAM carrier by dividing a scrambled version of the input sequence into groups of N consecutive bits. Each group is then subdivided into first and second subsets of r and $r^1$ bits, where $r + r^1 = N$. At least one of the bits in the first subset is applied to a finite state machine (such as a convolution encoder) which is arranged to expand the applied bits by at least one additional bit, in accordance with a prescribed logic arrangement. At least one bit in the second subset is processed similarly but independently, using a different finite state machine, or by time sharing a single finite state encoder. The expanded bit subsets, which include at least $r+1$ and $r^1+1$ bits, respectively, are then mapped into in-phase and quadrature symbols such that the minimum euclidean distance for an error event is larger than that obtained from an uncoded system. The symbols to be transmitted are then filtered and the filter output is modulated using conventional QAM methods.

8 Claims, 10 Drawing Figures

FIG. 4
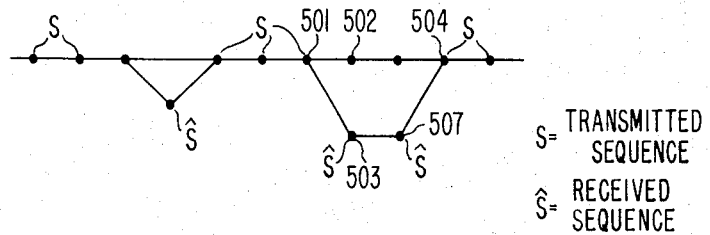
FIG. 5
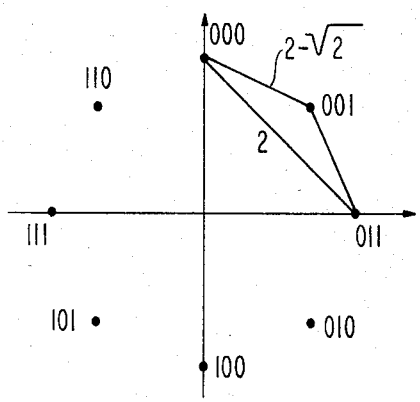
S = TRANSMITTED SEQUENCE
$\hat{S}$ = RECEIVED SEQUENCE
FIG. 9
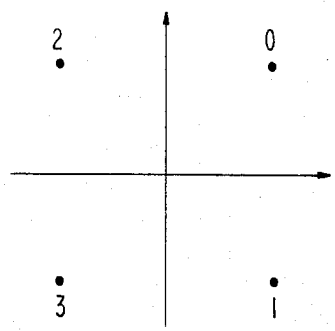
FIG. 10

METHOD AND APPARATUS FOR CODING A BINARY SIGNAL

BACKGROUND OF THE INVENTION

The present invention relates generally to coding of binary signals, and in particular, to a technique in which a sequence of bits is encoded for transmission on a quadrature amplitude modulated (QAM) carrier signal.

DESCRIPTION OF THE PRIOR ART

For synchronous transmission of digital data over a channel, a carrier signal can be so modulated that it assumes at each of discrete, equidistant sampling times one signal value from a given number of discrete signal values. These discrete values can be taken from a real-valued (amplitude modulation) or from a complex-valued (amplitude and phase modulation) set of channel symbols. One bit can be transmitted per sampling interval if two discrete channel symbols (signal values) are allowed. For the transmission of n bits per sampling interval, $2^n$ different discrete values are normally required.

Hence, the larger the number of available discrete channel symbols, the more information can be transmitted per unit time. The recognition of transmitted channel symbols in the receiver, assuming a given signal power, becomes more difficult as the number values increase because these values are spaced more closely and an amplitude or phase error caused by superimposed disturbances is more likely to result in a decision error. Therefore, with a given signal-to-noise ratio the error probability is increased if the number of discrete carrier signal values is increased.

A decrease in error probability may be achieved by using channel coding with certain restrictions on the permitted sequences of channel symbols. The rules followed in the coding process require introduction of a redundancy which during the subsequent sequential decoding process, facilitates determining from a sequence of disturbed channel symbols the channel symbol sequence which was most likely transmitted. Thereby, a significant reduction in error probability can be achieved. Examples are described in the articles "Viterbi Decoding for Satellite and Space Communication," by J. A. Heller et al., published in IEEE Trans. Comm. Tech., Vol. COM-19 (1971), pp. 835-848, and "The Viterbi Algorithm," by G. D. Forney, published in Proc. IEEE, Vol. 61 (1973), pp. 263-278.

One technique for transmission of a bit sequence by modulation of a carrier signal in which channel coding is used to decrease the probability of errors in the receiver is described in U.S. Pat. No. 4,077,021 issued to I. P. Csajka et al. on FEB. 28, 1978. In accordance with that invention, the bit sequence being encoded is subdivided into groups each consisting of r bits, and each r-bit group is expanded by a sequential coder having, for example, four internal states, into a group of $r+1$ bits. In response to each $(r+1)$ bit group the carrier signal is modulated to assume one out of $2^{r+1}$ discrete carrier signal values, the assignment between expanded bit groups and carrier signal valaues being so selected that $2^{r-1}$ carrier signal values correspond to each transition from one internal state of the coder to one of two possible follower states. These $2^{r-1}$ carrier signal values have a larger minimum distance from each other than the absolute minimum distance within the set of $2^r$ discrete signal values used in conventional nonredundantly coded transmission, thus tending to reduce the error rate in the receiver.

The advantages achieved by the Csajka technique include either a possible reduction of the energy of the data transmission signals because of the reduced error event probability at a given signal-to-noise ratio, or alternatively the ability to transmit at a given signal power despite a degradation in the disturbance conditions in the channel. This is due to the fact that the minimum possible Euclidian distance between allowed sequences of signal values is larger than in the corresponding nonredundantly coded transmission, so that by a soft Viterbi-decoding operation in the receiver a safer determination of the transmitted signal values can be made from the received signal values. In such a sequential decoding operation the most likely sent sequence of channel symbols is determined directly from the non-quantized signal sample values.

In spite of the foregoing advantages, the above described technique suffers in that the decoding procedure is quite complex. This complexity occurs for two reasons. First, when the value of r is three or more, which would be the case in high speed voice band data transmission, the dependence between the in-phase and quadrature symbols leads to a requirement that the Viterbi decoder compute a large number of "metrics", each of which are measures of the distance squared between the received sample point and every point in the signal constellation. This computation can be quite time consuming. Second, if r is three or more, the number of branches in the trellis diagram which represents the operation of the convolution encoder becomes large, so that a large number of branches also merge into each state. As a result, a large number of comparisons is required in the path updating operation of the Viterbi decoder. The foregoing problems are evident from a consideration of a paper entitled "Channel Coding with Multilevel/Phase Signals," by G. Ungerbeock, *IEEE Transactions on Information Theory*, Vol IT 28, No. 1, January 1982, pp. 55-67.

Additionally, in certain cases, the gain obtained by using a convolutional encoding technique in which r is three or more can be improved upon. Finally, the prior art arrangement is not capable of easy adaptation when it is desired to "fall back" to one or more coded modes in which the coder speed is a fraction of its normal speed.

In view of the foregoing, it is the broad object of the present invention to improve the manner in which a sequence of bits is encoded before being transmitted via a modulated carrier signal. Specific objects include provision of a channel coding technique which improves the resistance of the decoded signal to errors even when the data transmission requirements dictate the use of a convolutional encoder in which r is three or more, and which does not require the complex processing and memory capabilities heretofore thought necessary for decoding.

SUMMARY OF THE INVENTION

In accordance with a preferred embodiment of the present invention, a sequence of bits to be transmitted is divided into groups of 4 consecutive bits called quadbits. The first 2 bits of a quadbit are fed into a four state (i.e., $\nu=2$) convolutional encoder with rate $\frac{2}{3}$, which may be configured as shown, for example, in FIG. 5 of the above-cited Csajka patent. The last two bits are passed into an identical but independent convolutional encoder, so that the first two bits and the last two bits are coded similarly but independently. The output of the first convolutional encoder is mapped into a set of in-phase channel symbols such as the set ±1, ±3, ±5, ±7 shown in FIG. 1. The output of the second encoder is mapped into a set of quadrature channel symbols, thus completing the 64 point QAM constellation of FIG. 1. Modulation of a carrier signal in accordance with the in-phase and quadrature symbols is then performed in a conventional manner.

In the more general case, the input bit sequence, which may be scrambled conventionally before processing in accordance with the invention, is divided into groups of N consecutive bits. Each group is then subdivided into first and second subsets of $r$ and $r^1$ bits, where $r+r^1=N$. At least one of the bits in the first subset is applied to a finite state machine (such as a convolution encoder) which is arranged to expand the applied bits by at least one additional bit, in accordance with a prescribed logic arrangement. At least one bit in the second subset is processed similarly but independently, using a different finite state machine, or by time sharing a single finite state encoder. The expanded bit subsets, which include at least $r+1$ and $r^1+1$ bits, respectively, are then mapped, as mentioned previously, into in-phase and quadrature symbols such that the minimum euclidean distance for an error event is larger than that obtained from an uncoded system. The symbols to be transmitted are then filtered and the filter output is modulated using conventional methods.

By virtue of the independent coding of the in-phase and quadrature components, the number of required encoder states is advantageously reduced, simplifying the required decoder structure. The technique nevertheless permits decoding of the modulated carrier signal at the receiver with reduced errors as compared to both known non-redundant coding and to channel coding (for a given value of $v$) as described by Csajka et al.

BRIEF DESCRIPTION OF THE DRAWING

The foregoing and additional features and advantages of the present invention will be better understood from the following detailed description when read in light of the accompanying drawing in which:

FIG. 4 illustrates one arrangement for mapping the output of the encoder of FIG. 2 onto an 8 point amplitude modulation constellation;

FIG. 5 is an illustration of error events during decoding using a Viterbi algorithm decoder;

FIGS. 9 and 10 illustrate signal constellations useful in two different fallback modes of the encoder of FIG. 6, which can implement 4800 and 2400 bps encoders.

DETAILED DESCRIPTION

In order to achieve a significant amount of improvement in SNR margin over conventional 4×4 QAM techniques, the present invention combines channel coding and modulation. As mentioned earlier, a similar but less efficient approach is described in U.S. Pat. No. 4,077,021 and in the Ungerboeck article, both of which may be referred to for a general understanding of its background and principles.

To grasp the key concepts behind coding and modulation, consider first the coding of a sequence of bits $X_1^1, X_2^1, X_1^2, X_2^2, \ldots X_1^n, X_2^n$ by partitioning the sequence into bit pairs $X_1^n$ and $X_2^n$, where it is desired to transmit one pair every T seconds. Using a one-dimensional four level signal, each of the four possible combinations (00, 01, 10, 11) of values of each bit pair can be associated with one of four possible amplitude levels, each of which is a signal point along an axis. The minimum distance d between the signal points determines the probability of error: the larger the value of d, the lower the probability of error. The purpose of combined coding/modulation is to increase the effective minimum distance without affecting the bandwidth or the average transmitted power.

In channel coding, redundancy is introduced by using more points in the signal constellation than is needed for the corresponding uncoded system. Dependency is introduced between each successive transmitted symbol in the expanded signal constellation, using a prescribed set of rules for symbol succession. For "good" codes, the minimum possible euclidean distance between allowed sequences of symbols is larger than in the corresponding non-redundantly coded system, so that the same level of noise is less likely to cause a detection error.

The most straightforward way of coding so as to introduce dependency between each successive transmitted symbol (which represents a selected number of input bits) and thus insure that the symbol sequence follows prescribed rules is to use a convolution encoder, followed by a prescribed mapping of the encoder outputs onto the set of channel symbols. This mapping is desirably such that, for a given average power, the probability of estimating an incorrect symbol succession is minimized. Viewed in signal space, this is equivalent to maximizing the euclidean distance between the correct symbol sequence and all possible incorrect symbol sequences.

Figure 2:
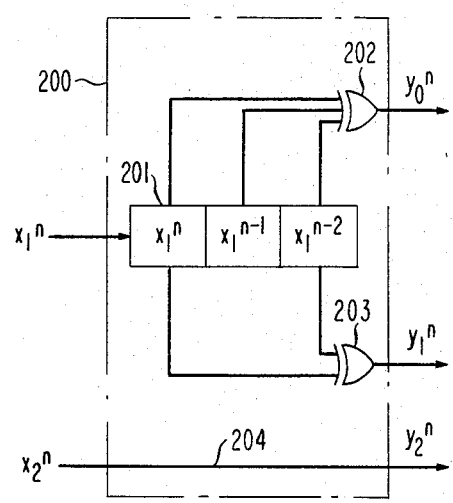
FIG. 2 is a block diagram of a prior art convolutional encoder.

FIG. 2 shows such a simple convolution encoder of the type described in the Csajka patent. As shown, the two information bits, $X_1^n$ and $X_2^n$, pass through a convolution encoder 200 and yield the triplet $Y_0^n$, $Y_1^n$ and $Y_2^n$ as the output bits, which may then be mapped onto eight signal points.

As shown in FIG. 2, convolutional encoder 200 may include a memory element such as a three-bit shift register 201 which receives the first bit $X_1^n$ from each pair of input bits and stores that bit as well as the first bit $X_1^{n-1}$ and $X_1^{n-2}$ from the previous two pairs of input bits. As each bit pair is processed, the contents of register 201 are shifted one position to the right. A first output, $Y_0^n$ from encoder 200 is formed by exclusive OR'ing the three bits ($X_1^n$, $X_1^{n-1}$ and $X_1^{n-2}$) stored in register 201 using exclusive OR gate 202, while the second output $Y_1^n$ is obtained by exclusively OR'ing only the first and last bits ($X_1^n$, $X_1^{n-2}$) in that register using exclusive OR gate 203. A third output, $Y_2^n$, is obtained simply by extending the second input bit $X_2^n$, on lead 204. The rate R of encoder 200 is normally stated as $\frac{2}{3}$, because there are two input and three output bits.

Figure 3:
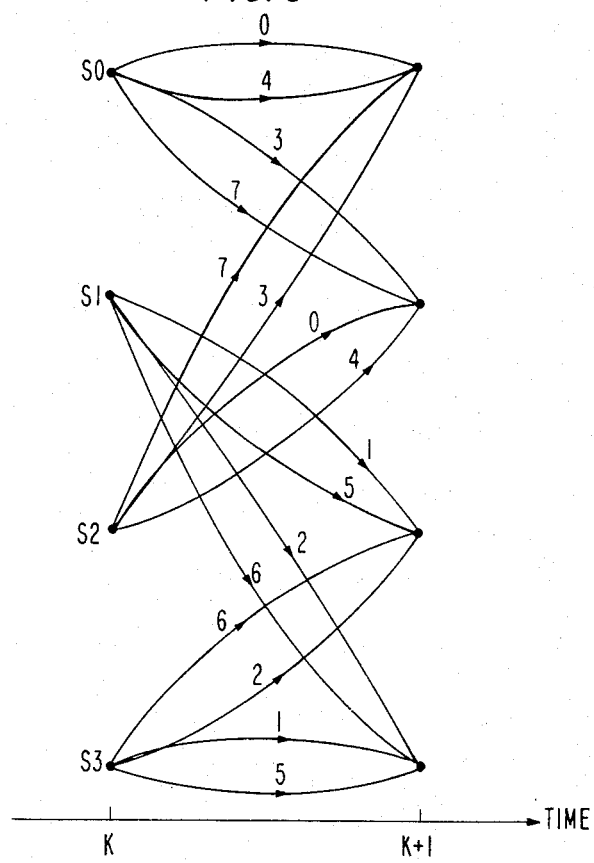
FIG. 3 is a trellis diagram showing the possible states for the encoder of FIG. 2.

Convolution encoder 200 may be viewed as a finite state machine having an input-output state relationship described by a trellis diagram as shown in FIG. 3. The number of possible states available in encoder 200 is $S = 2^\nu$, where $\nu$ is the number of memory locations in the encoder excluding the current input $X_1^n$. The encoder in FIG. 2 thus has $\nu=2$, since the values of $X_1^{n-1}$ and $X_1^{n-2}$ are stored, and the number of possible states is $S=4$. The trellis diagram of FIG. 3 for this four-state code has four branches that emerge from each of the four possible states S0, S1, S2 and S3 that may be assumed by bits $X_1^{n-1}$ and $X_1^{n-2}$ in register 201. The branches correspond to the four possible combinations of the input bits $X_1^n$ and $X_2^n$. In general, the number of branches extending from each state is $2^m$, where m is the number of bits input to the encoder. The convention used to label the trellis of FIG. 3 is that the first (top), second, third and fourth (bottom) branches emerging from a state denote, respectively, the outputs that correspond to input bits "00", "01", "10", and "11". The value associated with each branch is determined by the three-bit coded output $Y_0^n Y_1^n Y_2^n$, in accordance with the binary numbering system. It will be seen from FIG. 3 that the arrangement of coder 200 permits transitions from each state at time $t=K$ to only two of the four follower states at time $t=K+1$. Thus, from state S0, transitions to succeeding or to follower states S0 and S1 are possible, while transitions from state S1 are only permitted to follower states S2 and S3. Similarly, state S2 can yield follower states S0 and S1, while state S3 can yield follower states S2 or S3. The combinations of inputs $X_1^n$ and $X_2^n$ which cause each transition are not, however, unique.

Decoding of the four-state code just described is efficiently accomplished in the maximum likelihood sense by the Viterbi algorithm (described in the Forney reference cited above) which is a dynamic programming algorithm for finding the shortest path (most likely sequence) through a trellis such as the trellis of FIG. 3. This algorithm is a recursive procedure based on the received signal sample, which calculates a metric for each possible transition (branch) in the trellis, adds these metrics to the accumulated branch metrics (called the path metric) from previous symbol intervals, and then retains only the $2^\nu$ shortest path metrics, one for each state. With such soft-decision decoding, the branch metrics are measures of the euclidean distance (in the signal space) between the received sample and the corresponding branch signal point.

Figure 1:
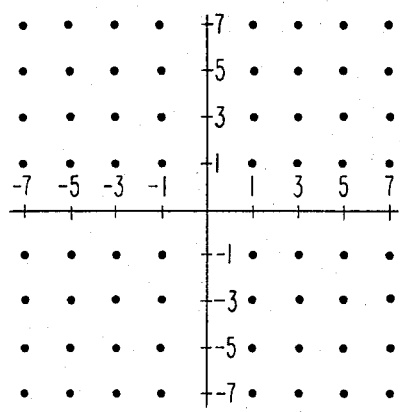
FIG. 1 illustrates the 64 point signal constellation used in the encoding/decoding technique of the present invention.

In an illustrative embodiment of the present invention, the trellis structure of FIG. 3, obtained by using the convolutional encoder of FIG. 2, is used to improve the ability of a coded bit stream to be decoded with a minimum of errors. Specifically, to maximize the minimum euclidean distance for error events, two independently operating convolution encoders are used to process successive groups of four inputs bits, which are divided into two subsets of two bits each. Each encoder, which receives bits from a given subset, is arranged to expand the two bits into a set of three bits (as shown in FIG. 2), which can be mapped into one of eight levels $\pm d, \pm 3d, \pm 5d, \pm 7d$, as shown in FIG. 4. The mapped outputs are then used to modulate quadrature carriers thus resulting in the 64 point constellation illustrated in FIG. 1. With this mapping, the average signal power is $21d^2$ and the minimum euclidean distance is $36d^2$. Therefore, the signal to noise ratio (gain) with respect to a conventional 16-point rectangular constellation is:

$$G_a = 10 \log \frac{36d^2/21d^2}{4d^2/5d^2} \approx 3.3 \text{ dB}. \tag{1}$$

To see the role of modulation on performance, reference is made to FIG. 5, which illustrates the concept of error events in maximum-likelihood sequence estimation. In FIG. 5, s denotes the actual transmitted sequence, and $\bar{s}$ the sequence chosen by the Viterbi algorithm decoder. Over a long time the probability of an error event is inversely related to the distances between the signal points in the correct sequence (e.g., points 501, 502, 504) and the signal points in the possible incorrect sequences (e.g., points 503, 507) and is dominated by the error event with the minimum euclidean distance (MED). By assigning signal points to the encoder outputs in a way that maximizes the MED for a given code, the performance of the coded system can be optimized. In other words, to achieve improved system performance, modulation and coding must be integrated. The coding technique of the present invention is based on this idea, and uses coding in the signal space, and not in the binary field as commonly used for error correction.

Figure 6:
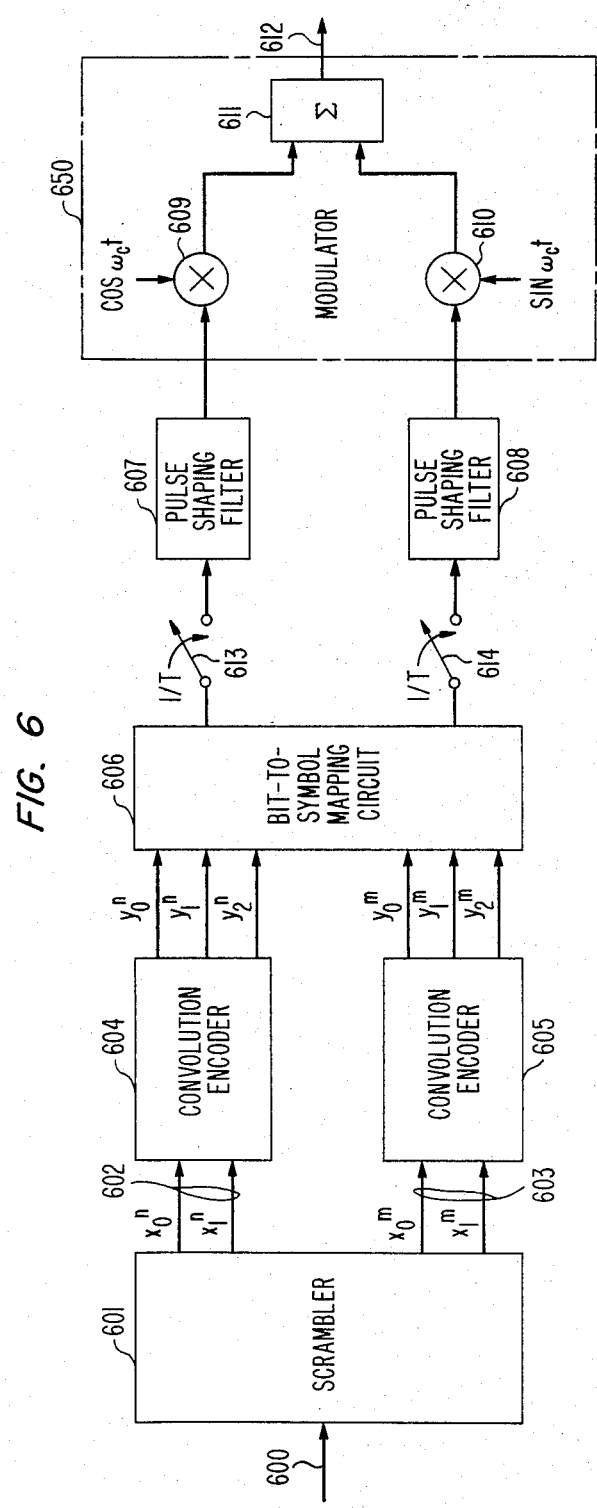
FIG. 6 is a block diagram of apparatus arranged in accordance with the present invention for encoding a sequence of bits for transmission on a modulated carrier signal.

Referring now to FIG. 6, there is shown in block diagram form one embodiment of a transmitter arranged in accordance with the present invention for encoding a sequence of bits and transmitting the information contained in the sequence on a quadrature modulated carrier signal. The input bits, received sequentially on line 600, may be preprocessed in a scrambler 601 of conventional design, and then accumulated into groups of N bits. In FIG. 6, N=4 and each group of four bits is called a quadgroup. The bits in each quadgroup are divided into first and second two-bit subsets, represented respectively by the two pairs of outputs on lines 602 and 603. Where groups of size other than N=4 are used, the outputs from scrambler 601 are normally divided into subsets of nearly equal size. In FIG. 6, the signals on lines 602 are designated $X_0^n$ and $X_1^n$, while the outputs on lines 603 are designated $X_0^m$ and $X_1^m$, which indices n and m increase simultaneously at the sample rate 1/T. In accordance with the present invention, bits in each subset on lines 602, 603 are applied to *separate* convolutional encoders (604, 605, respectively), each of which is illustratively arranged as shown in FIG. 3, and each operating independently. Alternatively, a different type of finite machine can be used, and a single encoder can be time shared to process bits in each subset. Each encoder produces its own set of encoded output bits, namely, bits $Y_0^n$, $Y_1^n$ and $Y_2^n$ from encoder 604 and bits $Y_0^m$, $Y_1^m$ and $Y_2^m$ from encoder 605. Each expanded set of bits is produced as described previously, namely, by combining in a prescribed manner at least one input bit from each subset with one or more bits from previously processed subsets. These outputs are mapped to symbols in a bit/symbol mapping circuit 606. Specifically, the output from each encoder, which comprises three bits, is mapped to a corresponding symbol on the eight point AM constellation as shown in FIG. 4. The individual outputs of circuit 606 are supplied to respective conventional pulse shaping filters 607 and 608 via switches 613 and 614 which are closed at the sampling rate 1/T and filters outputs are then applied to a modulator 650. Illustratively, modulator 650 may include individual modulators 609 or 610 which modulate in-phase and quadrature components of frequency $w_c t$ with the respective filter outputs in a well known manner. The modulator outputs are then combined in a summer 611. Alternatively, modulator 650 may include other known arrangements such as ROM implemented look-up tables which digitally compute sample values of a QAM signal in accordance with the applied symbols. The output of modulator 650 on line 612 may be transmitted to a remote decoder via an analog transmission medium.

Figure 7:
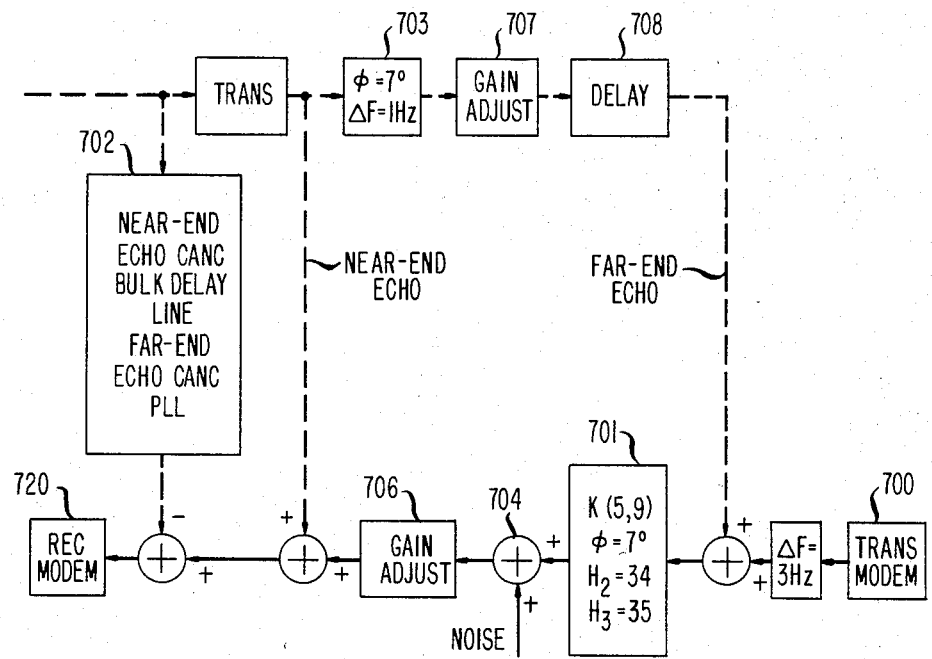
FIG. 7 illustrates the configuration used to test the performance of the encoder arrangement shown in FIG. 6.

The performance of the encoder arrangement of FIG. 6 was tested for both half duplex and full duplex operation, using the configuration shown in FIG. 7.

The encoder 700 under test was connected to a receiver 720 via several circuits which simulated expected channel conditions. More specifically, the channel impairment conditions used during testing were intended to represent the 90 percent "worst-case" conditions as obtained from the Bell System 1969/70 connection survey published in "Analog Transmission Performance on the Switched Telecommunications Network", BSTJ, Vol. 50, No. 4, April 1971, pp. 1311–1348. The channel impairments provided by simulator circuit 701 were 34 dB of second harmonic distortion $H_2$, 35 dB of third harmonic distortion $H_3$, and 7 degrees of peak-to-peak phase jitter $\Phi$. A 3 Hz frequency offset was introduced by circuit 705 since ±3 Hz will be exceeded in less than 10 percent of the connections. The slope and envelope delay distortion (EDD) were as specified in Table 1, below.

TABLE 1

LINEAR SLOPE AND EDD FOR CHANNEL K (5,9)
Linear slope between 1 KHz and 3 KHz is 12.5 dB.

| Frequency | EDD in Microseconds Relative to 1600 Hz |
|---|---|
| 700 | 1795 |
| 900 | 1155 |
| 1100 | 625 |
| 1300 | 210 |
| 1500 | 0 |
| 1700 | 0 |
| 1900 | 140 |
| 2100 | 260 |
| 2300 | 460 |
| 2500 | 965 |
| 2700 | 1805 |
| 2900 | 2835 |

In addition, for the full-duplex tests which were performed using the additional elements shown by dotted connections, the ratio of received signal power to far echo was subjected to an additional 7 degrees of peak-to-peak phase jitter and 1 Hz of frequency offset, using circuit 703. Gain adjustments in the forward and return paths were provided by circuits 706 and 707, respectively, and element 708 introduced return path delay.

Noise, having a flat spectrum over a frequency band of 300 Hz to 5 kHz, was introduced at the receiver input via adder 704. The noise power in the frequency band below 3 kHz was measured with a C-message weighting network. The signal to C-Message Weighted Noise Ratio ($SNR_c$) was then determined by subtracting the measured noise power from the power at the receiver input at a 1004 Hz tone substituted for the transmitted signal at the input to the simulated network connection. The transmitted tone power was adjusted to be equal to the average power of the transmitted data signal. (Note that the actual received data signal-to-noise is ratio generally smaller.) The block error rate (BLER) was then determined for various $SNR_c$.

Figure 8:
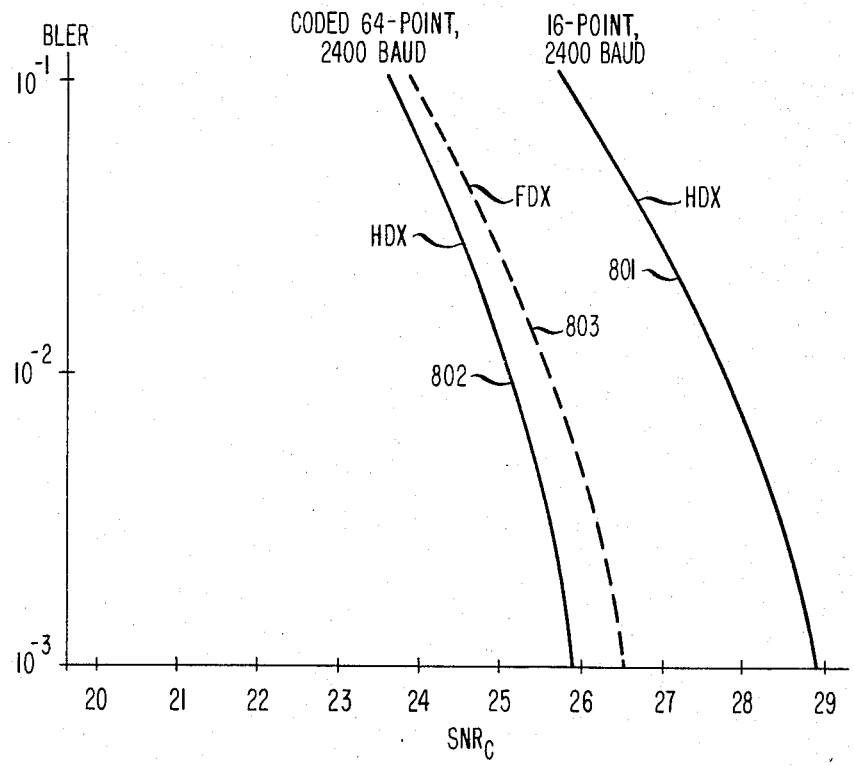
FIG. 8 illustrates the results of the tests performed using the test configuration of FIG. 7 on the encoder arrangement of FIG. 6.

The performance curve 801 for a 2400 baud 16 point (4×4), QAM modem operating at 9600 bit/sec half-duplex is shown in FIG. 8 along with the curves 802, 803 for a coded 2400 baud 64 point, QAM modem arranged in accordance with the present invention and operating at 9600 bits/sec half- and full-duplex, respectively. The measured results, which closely agree with the theoretical predictions, demonstrate the superiority of the 2400 baud, coded 64 point QAM modem at 9600 bits/sec, as compared to the 16-point uncoded alternative.

In addition to the advantages already mentioned, the 9600 bps modem transmitter shown in FIG. 6 can be operated in a fallback mode at 4800 bps or 2400 bps. Since, in full duplex operation, the Viterbi decoder will be part of this modem, a similar channel coding method could be applied to those modes as well.

Using the 4-state, rate ⅔ encoder of FIG. 6, a 4800 bps mode can be achieved by using only one convolutional encoder 604. The mapping of encoded bits into channel symbols in encoder 604 can be carried out as shown in FIG. 9.

The above described approach will provide an asymptotic gain $$G_a^{4800} = 10 \log \frac{4.6}{2} \approx 3.3 \text{ dB}$$

with respect to the encoded case. Thus, in the fallback mode at 4800 bps, one of the Viterbi decoders at the receivers is disabled, and only one decoder is used to detect the received signals of the 8-phase QAM constellation of FIG. 9.

In the 2400 bps fallback mode, only the rate ½, $\nu=2$ code is used, and the uncoded bit is not used. This change does not alter the trellis structure, and the Viterbi decoder can operate as before. Thus, the encoded bits are mapped into channel symbols simply as shown in FIG. 10. Such an encoded system will provide an asymptotic gain in excess of 3.3 dB over the 600 baud, 16-point QAM uncoded system.

Various modifications and adaptations to the present invention may be made by those skilled in the art. Accordingly, it is intended that the invention be limited only by the appended claims. For example, the size N of the input bit groups need not be four as shown in FIG. 6, but can be any desired value. The number r of bits applied to encoder 604 may be equal to or different than the number $r^1$ of bits applied to encoder 605. In addition, the number of states, $\nu$, in convolution encoder 604 may be equal to or different than the number of states in convolution encoder 605. It is also to be understood that the encoder structure in FIG. 2 is for illustration purposes; the value of $\nu$ as well as the particular selection of inputs to the exclusive OR circuits 202 and 203 can be different. Finally, convolution encoders 604 and 605 can be replaced by apparatus which implements a suitably chosen table look-up scheme which provides either a linear or nonlinear relationship between its input and output bits.

What is claimed is:

1. Apparatus for encoding a sequence of input bits for transmission via a quadrature amplitude modulated carrier signal, comprising:

means responsive to first and second subsets of selected bits in each group of N consecutive ones of said input bits for forming first and second expanded versions of the bits in each of said first and second subsets, respectively, each of said expanded versions having at least one more bit than the subset from which it is formed, and means individually responsive to said first and second expanded versions for modulating in-phase and quadrature components of said carrier signal to generate an individual one of a predetermined constellation of signal points, wherein said forming means includes means for combining at least one bit in said first subset with at least one bit in the first subset of a preceding one of saidn N-bit groups and means for combining at least one bit in said second subset with at least one bit in the second subset of a preceding one of said N-bit groups, said combining and modulating means being arranged such that less than all possible sequences of said signal points is generated.

2. Apparatus for encoding a sequence of input bits by QAM modulation of a carrier signal, including:

first means for forming successive groups of $N = r + r^1$ bits in response to a scrambled version of said input bits, a finite state machine responsive to the first r bits in each group and in at least one preceding group for forming a first $r+1$ bit code word and responsive to the second $r^1$ bits in each group and in at least one preceding group for forming a second $r^1+1$ bit code word, and third means for modulating the in-phase and quadrature components of said carrier signal in accordance with amplitude levels that are assigned to said first and second code words, respectively, to generate an individual one of a predetermined constellation of signal points, said $r+1$ and $r^1+1$ bit code words being formed, and said amplitude levels being assigned, such that the minimum euclidean distance between generated sequences of said points is maximized.

3. Apparatus for encoding an input bit sequence comprising:

means responsive to said input sequence for providing groups of N output bits, each of said groups including a first subset of bits $X_0^n$ and $X_1^n$ and a second subset of bits $X_0^m$ and $X_1^m$ where n and m are indices of the group from which said subsets are derived, means including a convolutional encoder for expanding bits in each of said subsets as a specified function of bits in subsets of previous groups, to yield first and second multibit code words $Y_0^n Y_1^n Y_2^n$ and $Y_0^m Y_1^m Y_2^m$, and means for modulating in-phase and quadrature components of a carrier signal in response to first and second symbols generated in response to said first and second multibit code words.

4. The invention defined in claim 3 wherein said first multibit code word is related to said first subset of bits such that:

$$Y_0^n = X_1^n \oplus X_1^{n-1} \oplus X_1^{n-2}$$

$$Y_1^n = X_1^n \oplus X_1^{n-2}$$

$$Y_2^n = X_2^n$$

and said second multibit code word is related to said second set of bits such that $$Y_0^m = X_1^m \oplus X_1^{m-1} \oplus X_1^{m-2}$$

$$Y_1^m = X_1^m \oplus X_1^{m-2}$$

$$Y_2^m = X_2^m$$

where the symbol $\oplus$ represents the exclusive OR function.

5. A method of encoding a sequence of input bits for transmission via a quadrature amplitude modulated carrier signal, comprising the steps of:

forming, in response to first and second subsets of selected bits in each group of N consecutive ones of said input bits, first and second expanded versions of the bits in each of said first and second subsets, respectively, each of said expanded versions having at least one more bit than the subset from which it is formed, and modulating, in individual response to said first and second expanded versions, in-phase and quadrature components of said carrier signal to generate an individual one of a predetermined constellation of signal points, wherein said forming step includes combining at least one bit in said first subset with at least one bit in the first subset of a preceding one of said N-bit groups and combining at least one bit in said second subset with at least one bit in the second subset of a preceding one of said N-bit groups, said combining and modulating steps being such that less than all possible sequences of said signal points are generated.

6. A method of encoding a sequence of input bits by QAM modulation of a carrier signal, including the steps of:

forming successive groups of $N = r + r^1$ bits in response to a scrambled version of said input bits, forming, in response to the first r bits in each group and in at least one preceding group, a first $r+1$ bit code word and in response to the second $r^1$ bits in each group and in at least one preceding group, a second $r^1+1$ bit code word, and modulating the in-phase and quadrature components of said carrier signal in accordance with said first and second code words, respectively, to generate an individual one of a predetermined constellation of signal points, said $r+1$ and $r^1+1$ bit code words being formed, and said amplitude levels being assigned, such that the minimum euclidean distance between generated sequences of said points is maximized.

7. A method of encoding an input bit sequence comprising the steps of:

forming groups of N output bits, each of said groups including a first subset of bits $X_0^n$ and $X_1^n$ and a second subset of bits $X_0^m$ and $X_1^m$ where n and m are indices of the group from which said subsets are derived.

expanding bits in each of said subsets in a convolutional encoder as a specified function of bits in subsets of previous groups, to yield first and second multibit code words $Y_0^n Y_1^n Y_2^n$ and $Y_0^m Y_1^m Y_2^m$, and modulating in-phase and quadrature components of a carrier signal in response to said first and second symbols generated in response to said first and second multibit code words.

8. The method defined in claim 7 wherein said first multibit code word is formed from said first subset of bits such that:

$$Y_0^n = X_1^n \oplus X_1^{n-1} \oplus X_1^{n-2}$$

$$Y_1^n = X_1^n \oplus X_1^{n-2}$$

$$Y_2^n = X_2^n$$

and said second multibit code word is formed from said second set of bits such that $$Y_0^m = X_1^m \oplus X_1^{m-1} \oplus X_1^{m-2}$$

$$Y_1^m = X_1^m \oplus X_1^{m-2}$$

$$Y_2^m = X_2^m$$

where the symbol $\oplus$ represents the exclusive OR function.

* * * * *